United States Patent
Wakamatsu

(10) Patent No.: US 8,377,322 B2
(45) Date of Patent: Feb. 19, 2013

(54) PATTERN FORMING METHOD, SUBSTRATE PROCESSING METHOD AND MOLD STRUCTURE REPLICATION METHOD

(75) Inventor: Satoshi Wakamatsu, Odawara (JP)

(73) Assignee: Fujifilm Corporation, Tokyo (JP)

( * ) Notice: Subject to any disclaimer, the term of this patent is extended or adjusted under 35 U.S.C. 154(b) by 885 days.

(21) Appl. No.: 12/485,282

(22) Filed: Jun. 16, 2009

(65) Prior Publication Data

US 2009/0308841 A1 Dec. 17, 2009

(30) Foreign Application Priority Data

Jun. 16, 2008 (JP) .................................. 2008-156453

(51) Int. Cl.
*B44C 1/22* (2006.01)

(52) U.S. Cl. ................. 216/62; 216/48; 216/52; 216/57; 216/87

(58) Field of Classification Search .................. None
See application file for complete search history.

(56) References Cited

U.S. PATENT DOCUMENTS

| | | | | |
|---|---|---|---|---|
| 4,381,963 | A * | 5/1983 | Goldstein et al. ............. | 156/245 |
| 6,309,580 | B1 * | 10/2001 | Chou ........................... | 264/338 |
| 7,883,764 | B2 * | 2/2011 | Murao .......................... | 428/209 |
| 8,052,414 | B2 * | 11/2011 | Wakamatsu et al. .......... | 425/385 |
| 2007/0267764 | A1 | 11/2007 | Morimoto | |
| 2008/0152835 | A1 * | 6/2008 | Mayers et al. ................. | 427/532 |
| 2009/0028910 | A1 * | 1/2009 | DeSimone et al. ............ | 424/401 |
| 2009/0075122 | A1 * | 3/2009 | Nishikawa et al. ............ | 428/826 |
| 2009/0302001 | A1 * | 12/2009 | Mayers et al. .................. | 216/54 |
| 2009/0308841 | A1 * | 12/2009 | Wakamatsu ..................... | 216/37 |
| 2010/0173177 | A1 * | 7/2010 | Wakamatsu et al. ........ | 428/848.5 |
| 2012/0027950 | A1 * | 2/2012 | Wakamatsu et al. ........... | 427/553 |

FOREIGN PATENT DOCUMENTS

| | | |
|---|---|---|
| EP | 2037453 A1 * | 3/2009 |
| JP | 11-344804 | 12/1999 |
| JP | 2002-274077 | 9/2002 |
| JP | 2003-236390 | 8/2003 |
| JP | 2004-199086 | 7/2004 |
| JP | 2006-086249 | 3/2006 |
| JP | 2007-073712 | 3/2007 |
| JP | 2007-144995 | 6/2007 |

OTHER PUBLICATIONS

European Extended Search Report—09 00 7865—Sep. 5, 2012.
Japanese Official Action—2008-156453—Jul. 3, 2012.

\* cited by examiner

*Primary Examiner* — Allan Olsen
(74) *Attorney, Agent, or Firm* — Young & Thompson

(57) ABSTRACT

To provide a pattern forming method including: providing an active species supply source to at least one of a mold structure having a plurality of concave portions in its surface, and an object to be patterned; pressing the side of the mold structure, where the concave portions are provided, against the object so as to encapsulate the active species supply source in the concave portions; and oxidatively decomposing parts of the object which are in positions corresponding to the concave portions, by irradiating the active species supply source with excitation light through one of the mold structure and the object.

19 Claims, 3 Drawing Sheets

PATTERN FORMING METHOD, SUBSTRATE PROCESSING METHOD AND MOLD STRUCTURE REPLICATION METHOD

BACKGROUND OF THE INVENTION

1. Field of the Invention

The present invention relates to a pattern forming method, a substrate processing method and a mold structure replication method which enable a mold structure to be highly accurately and efficiently replicated without reversing a pattern.

2. Description of the Related Art

In a conventional nanoimprinting method, as shown in FIG. 1, a mold structure 3 having a concavo-convex pattern on its surface is pressed against a resin layer 2 formed on a substrate 1, and the concavo-convex pattern of the mold structure 3 is thus transferred into the resin layer 2. Subsequently, the substrate 1 is etched while convex portions formed in the resin layer serve as a mask. A structure (mold structure) 10 obtained has a transferred pattern which is an inversion of the pattern of the mold structure 3. Japanese Patent Application Laid-Open (JP-A) No. 2007-73712, for example, proposes an anodic oxidation patterning method using a conductive mold structure. In this proposal, however, parts of a substrate which are in positions corresponding to concave portions of the mold structure become convex portions of the substrate after etching, and thus an inversion of the pattern of the mold structure is formed in the substrate.

To produce a mold structure (by replication) having a pattern which is not inverted in accordance with such a nanoimprinting method, it is necessary to carry out nanoimprinting twice (original master→negative pattern→positive pattern).

Consequently, there are such problems that the process becomes complex, the incidence of defects becomes high and there is a decrease in accuracy.

As a pattern forming method other than the nanoimprinting method, JP-A No. 2003-236390 proposes a patterning method utilizing oxidation reaction, in which a photocatalytic pattern is used. In this proposal, however, the gap between the photocatalytic pattern and a substrate into which the pattern is to be transferred causes a decrease in resolution, and thus it is difficult to form a minute pattern of nanometer size.

Accordingly, in reality, provision of the following is hoped for: a pattern forming method, a substrate processing method and a mold structure replication method which make it possible to replicate a mold structure highly accurately by one-time imprinting, reduce the incidence of defects and form a minute pattern efficiently; and a mold structure obtained by the mold structure replication method.

BRIEF SUMMARY OF THE INVENTION

An object of the present invention is to provide a pattern forming method, a substrate processing method and a mold structure replication method, which enable a mold structure to be highly accurately replicated by one-time imprinting, reduce the incidence of defects and efficiently form a minute pattern.

As a result of carrying out a series of earnest examinations in an attempt to solve the above-mentioned problems, the present inventors have obtained the following knowledge: when a transparent mold structure is pressed against a substrate such that water or hydrogen peroxide is encapsulated as an active species supply source in concave portions provided in a surface of the mold structure, and the active species supply source is irradiated with excitation light (an ultraviolet ray) while the mold structure is being pressed against the substrate, active oxygen that is an active species is generated from the active species supply source. Having a high oxidation-reduction potential, the active oxygen generated in the concave portions is highly reactive and oxidizes the substrate surface. In the case where the substrate surface is formed of an organic material, the substrate surface is oxidatively decomposed. As for the outermost surface of the mold structure on the side where the concave portions are provided (hereinafter, the outermost surface is otherwise referred to as "convex portions"), even if there is an active species supply source between the convex portions and the substrate, oxidation reaction does not proceed because the amount of the active species supply source is very small. In the case where there is an organic thin film formed on the substrate surface, parts of the organic thin film which are in positions corresponding to the concave portions are decomposed and thus removed. When the substrate is etched, with the obtained organic thin film pattern serving as a mask, a concavo-convex pattern which is the same as the concavo-convex pattern of the mold structure (a concavo-convex pattern which is not inverted) can be formed in the substrate.

The present invention is based upon the above-mentioned knowledge of the present inventors, and means for solving the problems are as follows.

<1> A pattern forming method including: providing an active species supply source to at least one of a mold structure having a plurality of concave portions in its surface, and an object to be patterned; pressing the side of the mold structure, where the concave portions are provided, against the object so as to encapsulate the active species supply source in the concave portions; and oxidatively decomposing parts of the object which are in positions corresponding to the concave portions, by irradiating the active species supply source with excitation light through one of the mold structure and the object.

<2> The pattern forming method according to <1>, wherein at least a surface of the object includes an organic material.

<3> The pattern forming method according to one of <1> and <2>, wherein the object includes a substrate, and an organic thin film formed on a surface of the substrate.

<4> The pattern forming method according to any one of <1> to <3>, wherein the mold structure is made of one of quartz and a transparent resin.

<5> The pattern forming method according to any one of <1> to <4>, wherein the active species supply source is one of water and hydrogen peroxide.

<6> The pattern forming method according to any one of <1> to <5>, wherein the excitation light is an ultraviolet ray.

<7> A substrate processing method including: forming an organic thin film pattern on a surface of a substrate by the pattern forming method according to any one of <1> to <6>, and etching the substrate while the organic thin film pattern formed on the surface of the substrate serves as a mask.

<8> A mold structure replication method including: using the substrate processing method according to <7>.

<9> A mold structure obtained by the mold structure replication method according to <8>.

According to the present invention, it is possible to solve the problems with related art and provide a pattern forming method, a substrate processing method and a mold structure replication method, which enable a mold structure to be highly accurately replicated by one-time imprinting, reduce the incidence of defects and efficiently form a minute pattern.

Figure 1:
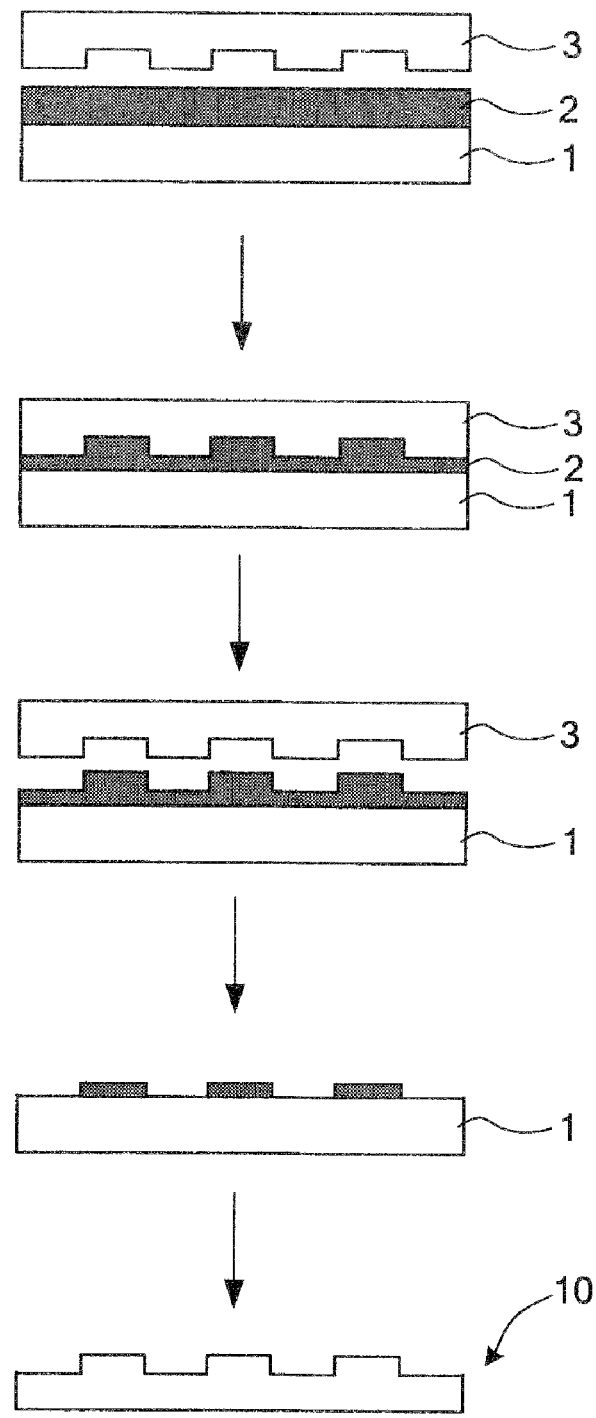
FIG. 1 is a process drawing for explaining a conventional nanoimprinting method.

DETAILED DESCRIPTION OF THE INVENTION (Pattern Forming Method)

A pattern forming method of the present invention includes at least a step of providing an active species supply source, a pressing step and an oxidatively decomposing step and, if necessary, includes other step(s).

<Step of Providing Active Species Supply Source>

The step of providing an active species supply source is a step of providing an active species supply source to at least one of a mold structure having a plurality of concave portions in its surface, and an object to be patterned.

—Object to be Patterned—

The object to be patterned is not particularly limited and may be suitably selected according to the purpose. However, an object, at least whose surface includes an organic material, is preferable; in this case, the entire object may be made of an organic material, with its surface being formed of an organic material which can be oxidatively decomposed by an active species. As an aspect in which the entire object is made of an organic material, there is, for example, an aspect in which a surface of a substrate (resin substrate) made of an organic material is covered with a pattern-forming organic thin film made of an organic material that is different from the organic material constituting the substrate and that can be oxidatively decomposed by an active species.

The organic material contained in the object is not particularly limited and may be suitably selected according to the purpose. Examples thereof include polyethylene terephthalate (PET), polyethylene naphthalate (PEN), polycarbonates (PC), low-melting-point fluorine resins, polymethyl methacrylate (PMMA) and triacetate cellulose (TAC).

Among these, PMMA is particularly preferable in that it can be easily oxidatively decomposed and has superior properties as a mask.

The object to be patterned is preferably composed of a substrate, and an organic thin film, formed on the substrate, that can be oxidatively decomposed by an active species.

The material for the organic thin film is not particularly limited as long as it can be oxidatively decomposed by an active species, with examples thereof being similar to those of the above-mentioned organic material.

The thickness of the organic thin film is not particularly limited and may be suitably selected according to the purpose. Preference is given to the range of 5 nm to 300 nm.

The organic thin film can be formed by spin coating, dip coating, spray coating or the like.

The shape, structure, size, material and the like of the substrate are not particularly limited and may be suitably selected according to the purpose. For instance, the shape will be a disc-like shape in the case of an information recording medium; the structure may be a single-layer structure or a laminated structure; the material may be suitably selected from known substrate materials, and examples thereof include nickel, aluminum, glass, silicon, quartz and transparent resins. These substrate materials may be used individually or in combination. Among these, quartz, glass and transparent resins are preferable for their transparency, with quartz being particularly preferable.

The substrate may be suitably synthesized; alternatively, a commercially available product may be used for the substrate.

The thickness of the substrate is not particularly limited and may be suitably selected according to the purpose. The thickness is preferably 50 µm or greater, more preferably 100 µm or greater. If the thickness is less than 50 µm, the mold structure may bend when the object to be processed and the mold structure are closely attached to each other, thereby making it impossible to secure a uniformly attached state of the object and the mold structure.

—Mold Structure—

The mold structure is not particularly limited and may be suitably selected according to the purpose. For instance, the mold structure includes a disc-like substrate, and a concavo-convex pattern formed by arranging a plurality of convex portions on one surface of the substrate and, if necessary, includes other component(s).

The material for the mold structure is not particularly limited and may be suitably selected according to the purpose, as long as it is transparent and can transmit excitation light. Suitable examples thereof include quartz, glass and transparent resins. The wavelength of the excitation light may be suitably selected according to the type of the active species supply source; however, the excitation light is preferably an ultraviolet ray.

Examples of the transparent resins include polyethylene terephthalate (PET), polyethylene naphthalate (PEN), polycarbonates (PC), low-melting-point fluorine resins, polymethyl methacrylate (PMMA) and polydimethylsiloxane (PDMS).

In view of the efficiency of excitation light irradiation, the mold structure preferably has a transmittance of 30% or more with respect to the excitation light; for the mold structure, use of quartz that is superior in light-transmitting property is particularly preferable.

On the concavo-convex pattern of the mold structure, a photocatalytic layer may be formed to enhance the efficiency of active oxygen generation. The photocatalytic layer is a layer formed of titanium oxide or tin oxide, for example.

Additionally, in order to curb oxidation reaction which occurs between convex portions of the mold structure and the substrate, upper surfaces or side surfaces of the convex portions may be formed of a metal, a resin, etc, which does not transmit the excitation light.

—Active Species Supply Source—

Examples of the active species used for the active species supply source include active oxygen (superoxide anion radicals, hydroxyl radicals, hydrogen peroxide, singlet oxygen, etc.).

Examples of the active species supply source include water (moisture) and hydrogen peroxide The active species supply source may contain oxygen, ozone, etc.; however, use of hydrogen peroxide for the active species supply source is particularly preferable in that hydroxyl radicals utilized as the active species are easily generated.

—Provision of the Active Species Supply Source—

The active species supply source is provided to at least one of the mold structure having a plurality of concave portions in its surface, and the object to be patterned, preferably provided to the object.

The method of providing the active species supply source is not particularly limited and may be suitably selected according to the purpose. Examples thereof include coating, immersion and spraying. Specific examples thereof include spin coating, dip coating and spray coating.

The amount of the active species supply source provided is not particularly limited and may be suitably selected, as long as a sufficient amount of the active species supply source can be encapsulated in the concave portions of the mold structure.

The surface(s) of at least one of the object and the mold structure, to which the active species supply source is to be provided, is/are preferably hydrophilized in advance. Examples of the hydrophilization include addition of a surfactant, and surface modification which utilizes UV ozone treatment.
<Pressing Step>

The pressing step is a step of pressing the side of the mold structure, where the concave portions are provided, against the object so as to encapsulate the active species supply source in the concave portions of the mold structure.

As to the pressurizing force applied when the mold structure is pressed, the greater it is, the more the active species supply source lying between convex portions and the object can be removed, thus enabling oxidation reaction of the active species to be curbed in the positions of the convex portions. However, if the pressuring force is too great, the object may possibly deform, so that the pressurizing force is preferably in the range of 0.1 MPa to 10 MPa.
<Oxidatively Decomposing Step>

The oxidatively decomposing step is a step of oxidatively decomposing parts of the object which are in positions corresponding to the concave portions, by irradiating the active species supply source with excitation light through either the mold structure or the object.

For the excitation light, use of a light source having a wavelength of either 184.9 nm or 253.7 nm is preferable. Examples of the light source include low-pressure mercury vapor lamps, high-pressure mercury vapor lamps and excimer lamps.

The amount of the excitation light applied is not particularly limited and may be suitably selected, as it varies depending upon the target of the oxidation reaction, the etching depth, etc. When a low-pressure mercury vapor lamp is used, for example, the excitation light is preferably applied at an irradiation intensity of 30 mW/cm$^2$ for approximately 1 minute to 30 minutes.

When the active species supply source is irradiated with the excitation light, the active species is generated, oxidatively decomposing parts of the object which are in positions corresponding to the concave portions of the mold structure. Then, when the object and the mold structure are separated from each other, an organic material pattern is formed on the surface of the object.

The excitation light is applied so as to pass through the transparent mold structure; alternatively, excitation light may be applied so as to pass through the object in the case where a transparent material is used for the object.
(Substrate Processing Method, Mold Structure Replication Method and Mold Structure)

A substrate processing method of the present invention is a method of processing a substrate, using the above-mentioned pattern forming method. The substrate processing method includes at least a step of etching a substrate while an organic thin film pattern formed on a surface of the substrate serves as a mask and, if necessary, includes other step(s).

A mold structure replication method of the present invention is a method of replicating a mold structure, using the substrate processing method of the present invention.

A mold structure of the present invention is a mold structure obtained by the mold structure replication method of the present invention.

In explaining the substrate processing method of the present invention, the following discloses details of the mold structure of the present invention and the mold structure replication method of the present invention.
<Etching Step>

The etching step is a step of etching a substrate while an organic thin film pattern formed on a surface of the substrate serves as a mask.

The etching is not particularly limited and may be suitably selected according to the purpose, and the etching may be wet etching or dry etching.

The wet etching may, for example, be performed by employing a combination of Si and a basic aqueous solution such as KOH aqueous solution, a combination of $SiO_2$ and a fluorine-based aqueous solution such as hydrofluoric acid, or a combination of a metal and an acid aqueous solution such as hydrochloric acid.

The dry etching may, for example, be RIE (reactive ion etching) or ion milling. A gas or gases used for the dry etching may be suitably selected according to the material of the substrate.

By the etching, a concavo-convex pattern which is the same as the concavo-convex pattern of the mold structure (a concavo-convex pattern which is not inverted) can be formed in the substrate.
<Other Step(s)>

Examples of the other step(s) include cleaning off an organic thin film by ashing or ozone cleaning, which remains on the substrate after the etching in the etching step, and thusly removing the organic thin film.

Here, the mold structure replication method of the present invention is explained with reference to FIG. 2.

Figure 2:
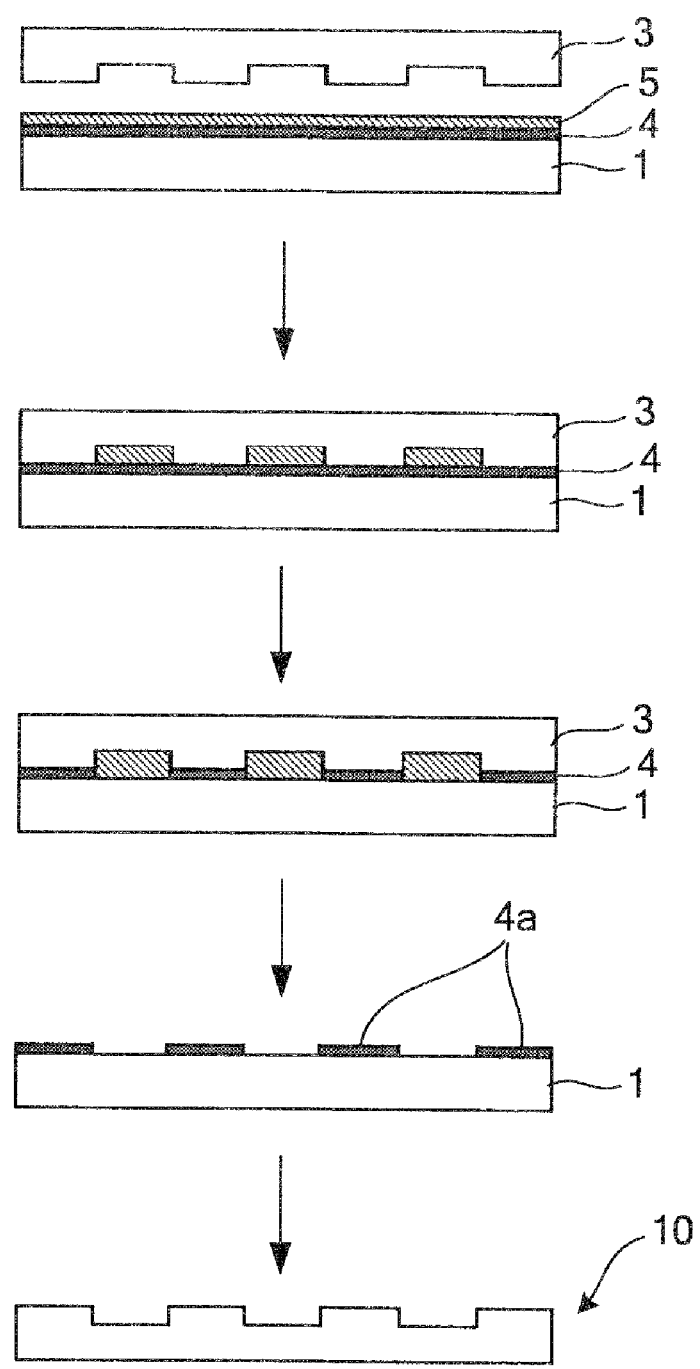
FIG. 2 is a process drawing showing an example of a mold structure replication method of the present invention.

FIG. 2 is a process drawing showing an example of the mold structure replication method of the present invention.

First of all, water or hydrogen peroxide is applied as an active species supply source 5 onto at least one of a mold structure 3 having a plurality of concave portions in its surface, and a substrate 1 with an organic thin film 4 formed on its surface. Examples of the application method include spin coating, dip coating and spray coating. The surface(s) of at least one of the substrate 1 and the mold structure 3, onto which the water or the hydrogen peroxide is to be applied, is/are preferably hydrophilized in advance.

Next, the substrate 1 and the mold structure 3 are laid one on top of the other and pressurized. As to the pressurizing force applied, the greater it is, the more the water or the hydrogen peroxide lying between convex portions of the mold structure and the substrate can be removed, thus enabling oxidation reaction to be curbed in the positions of the convex portions. However, if the pressuring force is too great, the substrate and the organic thin film may possibly deform, so that the pressurizing force is preferably in the range of 0.1 MPa to 10 MPa.

Subsequently, an ultraviolet ray as excitation light is applied so as to pass through the mold structure 3. Although the amount of the ultraviolet ray applied varies depending upon the target of the oxidation reaction, the etching depth, etc., the ultraviolet ray is preferably applied at an irradiation intensity of 30 mW/cm$^2$ for approximately 1 minute to 30 minutes, using a low-pressure mercury vapor lamp.

Next, after the application of the ultraviolet ray, the substrate 1 and the mold structure 3 are separated from each other. At this time, an organic thin film pattern 4a is formed on the substrate 1.

The formation of the organic thin film pattern 4a can be confirmed using a scanning electron microscope (SEM) or an atomic force microscope (AFM), for example.

Subsequently, the substrate 1 is wet-etched or dry-etched such that hollows having a predetermined depth are formed in the substrate 1.

Next, the organic thin film which remains on the substrate after the etching is cleaned off by ashing or ozone cleaning.

Thus, a structure (mold structure) 10 having a concavo-convex pattern which is the same as the concavo-convex pattern of the mold structure 3 (a concavo-convex pattern which is not inverted) can be obtained.

The mold structure obtained by the mold structure replication method of the present invention can be suitably used, for example, in production of information recording media such as magnetic recording media.

The foregoing has explained in detail an embodiment of the pattern forming method and an embodiment of the mold structure replication method according to the present invention. It should be noted that the present invention is not confined to these embodiments, and various alterations may be made provided that they do not deviate from the gist of the present invention.

EXAMPLES

The following explains Examples of the present invention. It should, however, be noted that the present invention is not confined to these Examples in any way.

Example 1

<Formation of Organic Thin Film Pattern and Replication of Mold Structure>
—Mold Structure—
A quartz structure having on its surface a line and space pattern of 600 nm in half pitch and 350 nm in depth was used.
—Substrate—
A quartz substrate having on its surface a PMMA thin film of 200 nm in thickness was used.
—Formation of a Pattern and Production of a Mold Structure by Replication—
A pattern was formed and a mold structure was produced by replication in accordance with the process shown in FIG. 2.

First of all, water was applied dropwise onto the PMMA thin film of the substrate. Then the side of the mold structure, where concave portions were provided, was pressed against the PMMA thin film and pressurized at 0.1 MPa.

Subsequently, an ultraviolet ray was applied at an irradiation intensity of 30 mW/cm$^2$ for 3 minutes, using a low-pressure mercury vapor lamp, so as to pass through the mold structure.

Figure 3:
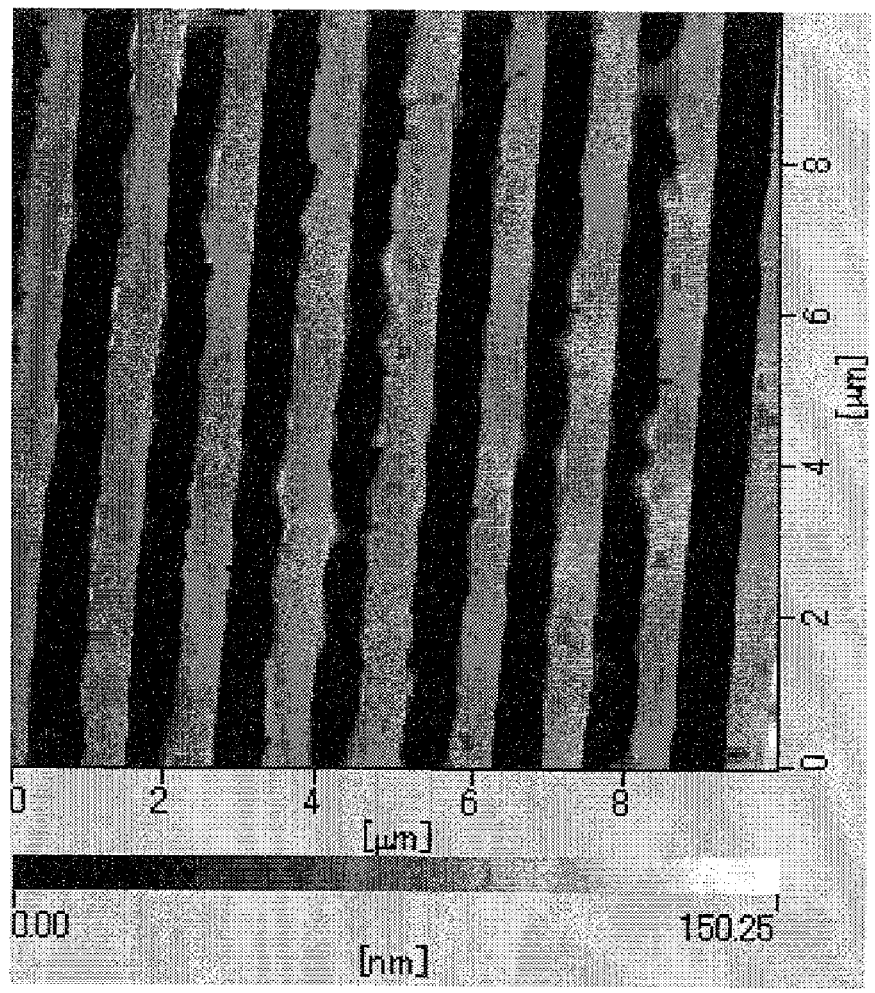
FIG. 3 shows an AFM (atomic force microscope) image of a PMMA (polymethyl methacrylate) thin film patterned by the present invention.

Next, after the application of the ultraviolet ray, the substrate and the mold structure were separated from each other. Here, when the substrate was observed using an AFM (SPI4000/SPA-300HV, manufactured by Seiko Instruments Inc.), formation of a PMMA thin film pattern, i.e. the PMMA thin film from which parts in positions corresponding to the concave portions of the mold structure had been removed by oxidative decomposition, was confirmed on the substrate as shown in FIG. 3.

Subsequently, with the obtained PMMA thin film pattern serving as a mask, the substrate was dry-etched (subjected to ashing to remove a residual film, and then RIE with a fluorine-based gas) such that hollows having a predetermined depth were formed in the substrate.

Next, the PMMA thin film which remained on the substrate after the etching was cleaned off by ashing.

Thus, a mold structure having a concavo-convex pattern which was the same as the concavo-convex pattern of the mold structure (a concavo-convex pattern which was not inverted) was obtained by replication.

Example 2

—Formation of a Pattern and Production of a Mold Structure by Replication—
Example 2 was carried out in a manner similar to Example 1, except that hydrogen peroxide was used as an active species supply source instead of water. An ultraviolet ray was applied at an irradiation intensity of 30 mW/cm$^2$ for 1 minute, using a low-pressure mercury vapor lamp. Consequently, since hydrogen peroxide is higher than water in oxidative decomposition rate, a PMMA thin film pattern, i.e. the PMMA thin film from which parts in positions corresponding to concave portions of the mold structure had been removed by oxidative decomposition, was formed on the substrate as in Example 1 even though the length of time of the etching had been shortened.

Subsequently, with the obtained PMMA thin film pattern serving as a mask, the substrate was dry-etched (subjected to ashing to remove a residual film, and then RIE with a fluorine-based gas) such that hollows having a predetermined depth were formed in the substrate.

Next, the PMMA thin film which remained on the substrate after the etching was cleaned off by ashing.

Thus, a mold structure having a concavo-convex pattern which was the same as the concavo-convex pattern of the mold structure (a concavo-convex pattern which was not inverted) was obtained by replication.

The pattern forming method, the substrate processing method and the mold structure replication method of the present invention make it possible to replicate a mold structure highly accurately by one-time imprinting without reversing a pattern, reduce the incidence of defects, and form a minute pattern efficiently. Therefore, they are very useful for replicating a mold structure.

What is claimed is:
1. A pattern forming method comprising:
providing an active species supply source to at least one of a mold structure having a plurality of concave portions in its surface, and an object to be patterned,
pressing a side of the mold structure, where the concave portions are provided, against the object so as to encapsulate the active species supply source in the concave portions,
irradiating the active species supply source encapsulated in the concave portions with excitation light through one of the mold structure and the object to generate an active oxygen species, and
oxidatively decomposing parts of the object which are in positions corresponding to the concave portions.
2. The pattern forming method according to claim 1, wherein the mold structure is made of one of quartz and a transparent resin.
3. The pattern forming method according to claim 1, wherein the active species supply source is one of water and hydrogen peroxide.
4. The pattern forming method according to claim 1, wherein the excitation light is an ultraviolet ray.
5. The pattern forming method according to claim 1, wherein the active oxygen species is one or more of superoxide anion radicals, hydroxyl radicals, hydrogen peroxide and singlet oxygen.

6. The pattern forming method according to claim 1, wherein the excitation light has a wavelength of 184.9 nm or 253.7 nm.

7. The pattern forming method according to claim 1, wherein the excitation light is generated from a low pressure mercury vapor lamp, a high pressure mercury vapor lamp or an excimer lamp.

8. The pattern forming method according to claim 1, wherein the excitation light is applied at an irradiation intensity of 30 mW/cm$^2$ for 1-30 minutes.

9. The pattern forming method according to claim 1, wherein at least a surface of the object comprises an organic material.

10. The pattern forming method according to claim 9, wherein the organic material comprises at least one of polyethylene terephthalate (PET), polyethylene naphthalate (PEN), polycarbonate (PC), low-melting-point fluorine resin, polymethyl methacrylate (PMMA) and triacetate cellulose (TAC).

11. The pattern forming method according to claim 1, wherein the object comprises a substrate, and an organic thin film formed on a surface of the substrate.

12. The pattern forming method according to claim 11, wherein the organic thin film on the substrate comprises at least one of polyethylene terephthalate (PET), polyethylene naphthalate (PEN), polycarbonate (PC), low-melting-point fluorine resin, polymethyl methacrylate (PMMA) and triacetate cellulose (TAC).

13. A substrate processing method comprising:
forming an organic thin film pattern on a surface of a substrate by a pattern forming method that comprises:
providing an active species supply source to at least one of a mold structure having a plurality of concave portions in its surface, and an object to be patterned, the object comprising the substrate and an organic thin film formed on a surface of the substrate,
pressing a side of the mold structure, where the concave portions are provided, against the object so as to encapsulate the active species supply source in the concave portions,
irradiating the active species supply source encapsulated in the concave portions with excitation light through one of the mold structure and the object to generate an active oxygen species, and
oxidatively decomposing parts of the object which are in positions corresponding to the concave portions, and
etching the substrate while the organic thin film pattern formed on the surface of the substrate serves as a mask.

14. The substrate processing method according to claim 13, wherein the active oxygen species is one or more of superoxide anion radicals, hydroxyl radicals, hydrogen peroxide and singlet oxygen.

15. The substrate processing method according to claim 13, comprising:
providing an object comprising a quartz substrate having on its surface a PMMA thin film;
applying water onto the PMMA thin film;
pressing a side of the mold structure where the concave portions are provided against the PMMA thin film so as to encapsulate the water in the concave portions;
irradiating ultraviolet light through the mold structure and to the water encapsulated in the concave portions to generate the active oxygen species;
oxidatively decomposing parts of the object that are in positions corresponding to the concave portions to form a film pattern on the surface of the substrate; and dry-etching the substrate, wherein the film pattern on the surface of the substrate serves as a mask.

16. The substrate processing method according to claim 13, comprising:
providing an object comprising a quartz substrate having on its surface a PMMA thin film;
applying hydrogen peroxide onto the PMMA thin film;
pressing a side of the mold structure where the concave portions are provided against the PMMA thin film so as to encapsulate the hydrogen peroxide in the concave portions;
irradiating ultraviolet light through the mold structure and to the hydrogen peroxide encapsulated in the concave portions to generate the active oxygen species;
oxidatively decomposing parts of the object that are in positions corresponding to the concave portions to form a film pattern on the surface of the substrate; and
dry-etching the substrate, wherein the film pattern on the surface of the substrate serves as a mask.

17. A mold structure replication method comprising: processing a substrate by a method which comprises:
forming an organic thin film pattern on a surface of a substrate by a pattern forming method that comprises providing an active species supply source to at least one of a mold structure having a plurality of concave portions in its surface, and an object to be patterned, the object comprising the substrate and an organic thin film formed on a surface of the substrate,
pressing a side of the mold structure, where the concave portions are provided, against the object so as to encapsulate the active species supply source in the concave portions, and
oxidatively decomposing parts of the object which are in positions corresponding to the concave portions by irradiating the active species supply source with excitation light through one of the mold structure and the object to generate an active oxygen species, and
etching the substrate while the organic thin film pattern formed on the surface of the substrate serves as a mask.

18. The mold structure replication method according to claim 17, wherein etching the substrate comprises wet etching with a combination of Si and a KOH aqueous solution, a combination of SiO$_2$ and hydrofluoric acid solution, or a combination of a metal and a hydrochloric acid solution.

19. The mold structure replication method according to claim 17, wherein etching the substrate comprises dry etching by reactive ion etching or ion milling.

* * * * *